United States Patent
Keum

(10) Patent No.: US 7,981,802 B2
(45) Date of Patent: Jul. 19, 2011

(54) METHOD FOR MANUFACTURING SHALLOW TRENCH ISOLATION LAYER OF SEMICONDUCTOR DEVICE

(75) Inventor: Dong-Yeal Keum, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/554,256

(22) Filed: Sep. 4, 2009

(65) Prior Publication Data

US 2010/0068865 A1     Mar. 18, 2010

(30) Foreign Application Priority Data

Sep. 17, 2008  (KR) .................. 10-2008-0090988

(51) Int. Cl.
*H01L 21/302* (2006.01)
*H01L 21/31* (2006.01)

(52) U.S. Cl. ........................................ 438/692; 438/759

(58) Field of Classification Search .................. None
See application file for complete search history.

(56) References Cited

U.S. PATENT DOCUMENTS

| 7,208,812 B2 * | 4/2007 | Ohta ........................... 257/510 |
| 7,300,877 B2 * | 11/2007 | Enomoto ..................... 438/693 |
| 2006/0063326 A1 * | 3/2006 | Brooks et al. ................. 438/243 |

* cited by examiner

*Primary Examiner* — Scott B Geyer
(74) *Attorney, Agent, or Firm* — Sherr & Vaughn, PLLC

(57) ABSTRACT

An electrical device, such as a semiconductor device, and methods of manufacturing the same. A semiconductor device having a shallow trench isolation (STI) layer may include a pad oxide layer formed over a semiconductor substrate, a trench formed over the substrate, a liner insulating layer formed over the trench, a gap-fill insulating layer formed over the liner insulating layer and a gate layer formed over the substrate. The gap-fill insulating layer may have a relatively and/or substantially planar polished surface. Methods of fabricating a semiconductor device having a shallow trench isolation (STI) layer may include performing a first chemical mechanical polishing over a gap-fill insulating layer to expose and/or target a portion of a liner insulating layer and performing a second chemical mechanical polishing over a gap-fill insulating layer to remove a portion of a liner insulating layer.

7 Claims, 5 Drawing Sheets

METHOD FOR MANUFACTURING SHALLOW TRENCH ISOLATION LAYER OF SEMICONDUCTOR DEVICE

The present application claims priority under 35 U.S.C. 119 to Korean Patent Application No. 10-2008-0090988, filed on Sep. 17, 2008, which is hereby incorporated by reference in its entirety.

BACKGROUND

Embodiments relate to an electrical device, such as a semiconductor device, and methods of manufacturing the same. Some embodiments relate to a semiconductor device having a shallow trench isolation (STI) layer and a method for manufacturing the STI layer.

Recently, techniques to manufacture a semiconductor device have been investigated due to their expanded use in a wide field of applications. Research and development has sought to increase integration density of a semiconductor device, which continues to improve at a relatively high rate. Due to the increase in integration density of a semiconductor device, research related to fine processing technique based miniaturization of a semiconductor device has also advanced. For example, techniques to reduce an isolation layer, which may operate to separate elements and integrate the elements in a semiconductor device, are increasing.

A Local Oxidation of Silicon (LOCOS) technique may be used as an isolation technique. In a LOCOS technique, a thick oxide layer may be selectively grown over a semiconductor substrate to form an isolation layer. However, this technique may fail to reduce the width of an isolation layer since an oxide layer may be formed over a portion where lateral diffusion of an isolation layer should be avoided. Thus, in a semiconductor device where element manufacturing may be on a submicron scale, the LOCOS technique may not be applicable.

A shallow trench isolation (STI) technique may be used as an isolation technique. A relatively shallow trench may be formed over a semiconductor substrate by an etching process in a STI technique, and an insulating material may be buried in the shallow trench. Thus, a relatively smaller isolation region using a STI technique may be achieved compared to a LOCOS technique. FIG. 1A to FIG. 1F are cross sectional views of a process to manufacture a shallow trench isolation layer of a semiconductor device.

Figure 1A:
Figure 1B:
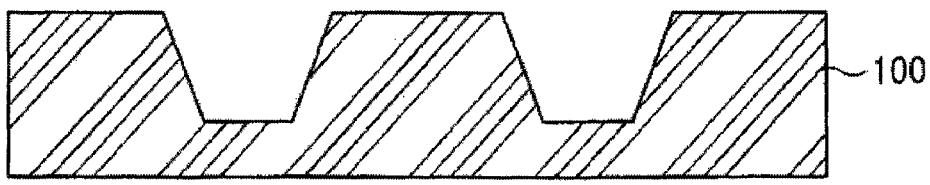

A pad oxide layer and a hard mask layer, for example a silicon nitride (e.g., $Si_3N_4$) layer, may be formed over a substrate such as silicon semiconductor substrate 100 illustrated in FIG. 1A. Referring to FIG. 1B, semiconductor substrate 100 may be etched, for example dry etched, to a certain depth using a pattern of a hard mask layer and/or a pad oxide layer. The depth may be between approximately 3000 Å to 5000 Å, and may form a shallow trench. A shallow trench isolation (STI) layer may then be formed therein.

Figure 1C:
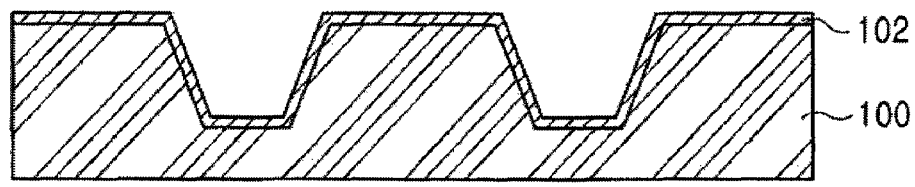

Referring to FIG. 1C, liner insulating layer 102, for example a silicon oxide (e.g., $SiO_2$) layer, may be substantially thinly formed over silicon substrate 100 having a shallow trench formed thereover. While forming the STI layer, for example in the case of a narrow width transistor, a transistor characteristic at a middle aspect ratio (for example, W/L=0.25/1) shows an abnormal phenomenon resulting from Si stress. Therefore, a liner insulating layer may be used to address the abnormal phenomenon.

Figure 1D:
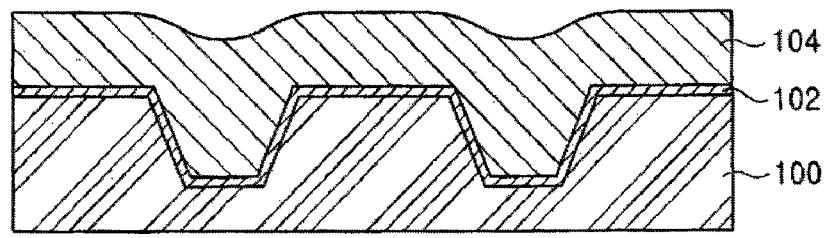
Figure 1E:
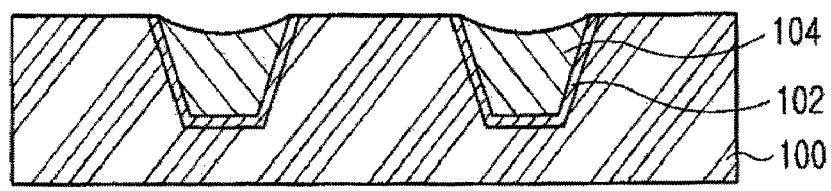

Referring to FIG. 1D, gap-fill insulating layer 104, for example a silicon oxide (e.g., $SiO_2$) layer and/or a tetraetylorthosilicate (TEOS) layer, may be deposited to bury a shallow trench. Gap-fill insulating layer 104 and liner insulating layer 102 may be partially removed when the hard mask layer is exposed, for example by Chemical Mechanical Polishing (CMP), to make a planar surface. Referring to FIG. 1E, liner insulating layer 102 and gap-fill insulating layer 104 may be formed as illustrated after planarization. The hard mask layer may be used as a lower nitride layer and may operate as an etching stop layer for gap-fill insulating layer 104.

Figure 1F:
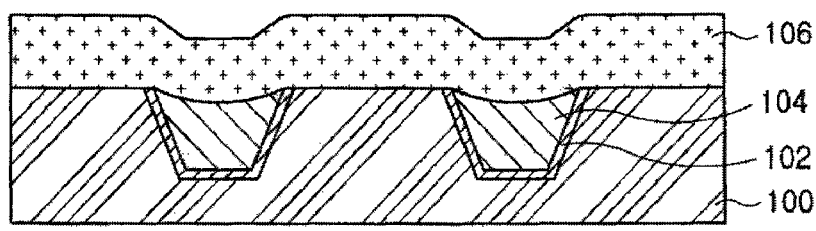

Referring to FIG. 1F, the hard mask layer may be removed, for example using phosphoric acid, and the pad oxide layer may be partly removed, for example by a cleansing process. A gate layer 106 may then be formed, thereby completing a shallow trench isolation layer. However, since a CMP process is conducted over a gap-fill insulating layer and a liner insulating layer until a hard mask layer is exposed, a dishing effect may occur when the CMP process is conducted over the gap-fill insulating layer and the liner insulating layer.

A dishing effect may cause problems at bridge or pattern formation in subsequent processes, such as a gate layer forming process. Thus, there is a need for a semiconductor device having a shallow trench isolation (STI) layer and a method for manufacturing the STI layer, which may lack and/or may prevent a dishing effect, and/or which may maintain a narrow width characteristic of a transistor.

SUMMARY

Embodiments relate to a method of manufacturing a shallow trench isolation layer. According to embodiments, a shallow trench isolation layer may prevent dishing effects over the region of the STI layer. In embodiments, the shallow trench isolation layer may maintain a narrow width transistor characteristic.

According to embodiments, a method to manufacture a shallow trench isolation layer may include forming a trench by an etching process over a substrate, such as a semiconductor substrate. In embodiments, the method may include forming a liner insulating layer over the inner side of the trench and depositing a gap-fill insulating layer to bury the trench. In embodiments, the method may include executing a first chemical mechanical polishing to target a portion of a liner insulating layer and executing a second chemical mechanical polishing to remove at least a portion of a liner insulating layer. In embodiments, a portion of a liner insulating layer may be removed by an etching process.

According to embodiments, a method to manufacture a shallow trench isolation layer may include forming a pad oxide layer over a semiconductor substrate and forming a pad nitride layer over the pad oxide layer. In embodiments, a hard mask layer may be deposited over the pad nitride layer. A hard mask layer, a pad nitride layer and/or a pad oxide layer may be patterned to form a trench in accordance with embodiments. In embodiments, a hard mask layer and/or a portion of a gap-filling insulating layer may be removed during a second chemical mechanical polishing. In embodiments, a pad nitride layer may be removed and a gate layer may be formed over a semiconductor substrate.

Embodiments relate to a device including a shallow trench isolation layer. According to embodiments, the device may include a pad oxide layer formed over a substrate and a trench formed over a substrate. In embodiments, the device may include a liner insulating layer formed over a trench and a gap-fill insulating layer formed over a liner insulating layer. A gate layer may be formed over a substrate in accordance with embodiments. In embodiments, a gap-fill insulating layer may exhibit a relatively and/or substantially planar polished surface.

Embodiments related to a CMP process that may be conducted, using different targets, over a gap-fill insulating layer. According to embodiments, a dishing effect over a shallow trench isolation may be eliminated and/or a narrow width characteristic of a transistor may be improved.

DRAWINGS

Example FIG. 1A to FIG. 1F illustrate cross sectional views of a method to manufacture a shallow trench isolation layer of a semiconductor device.

Example FIG. 2A to FIG. 2I illustrate cross sectional views of a method to manufacture a shallow trench isolation layer of a semiconductor device according to embodiments.

DESCRIPTION

Embodiments relate to a method of manufacturing an electrical device, such as a semiconductor device having a shallow trench isolation (STI) layer. Example FIG. 2A to FIG. 2I are cross sectional views illustrating a method of manufacturing a shallow trench isolation (STI) layer of a semiconductor device according to embodiments.

Figure 2A:
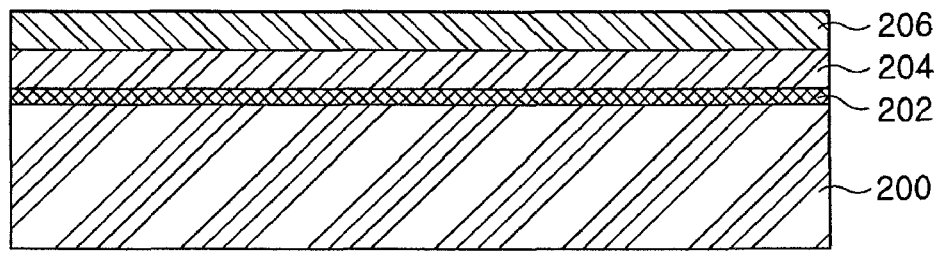

Referring to FIG. 2A, pad oxide layer 202 and/or pad nitride layer 204 may operate as a buffer. According to embodiments, the layers 202 and/or 204 may be grown over a substrate, such as silicon semiconductor substrate 200, by for example a thermal oxidation process. In embodiments, a nitride (e.g., $Si_3N_4$) layer such as hard mask layer 206 may be deposited over pad nitride layer 204. In embodiments, hard mask layer may have a thickness of between approximately 1000 Å to 2000 Å. In embodiments, a photoresist pattern may be formed over hard mask layer 206 and may define an active area and/or a shallow trench isolation area of a semiconductor device. The photoresist pattern may be formed by applying a photoresist, exposing the photoresist, and developing the photoresist using a mask pattern of the STI layer in accordance with embodiments.

Figure 2B:
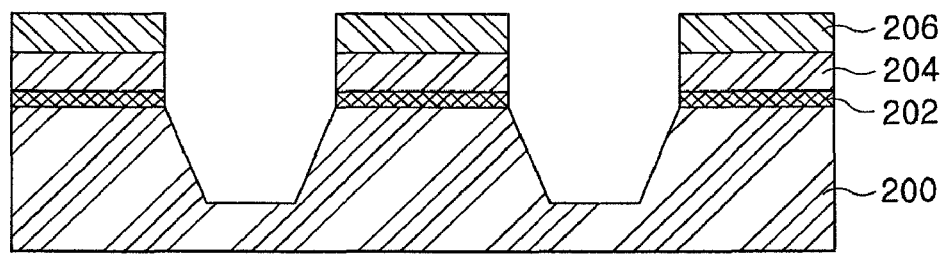

Referring to FIG. 2B, hard mask layer 206, pad nitride layer 204 and pad oxide layer 202 may be stacked over a substrate, such as silicon semiconductor substrate 200. According to embodiments, the layers 202, 204 and/or 206 may be patterned by an etching process, such as a dry etching process, using a photoresist pattern. In embodiments, a dry etching process of hard mask layer 206 may include performing a plasma dry etching process on a target nitride (e.g., $Si_3N_4$) layer with an etching reaction gas of $O_2$ and $CHF_3$ in an atmosphere gas of Ar, using for example Magnetically Enhanced Reactive Ion Etching (MERIE) etching equipment.

According to embodiments, $CHF_3$ gas may be injected into an MERIE etching equipment between approximately 40 sccm to 80 sccm, $O_2$ gas between approximately 0 sccm to 20 sccm, and the Ar gas between approximately 6 sccm to 120 sccm. In embodiments, pressure and an RF power of MERIE etching equipment may be between approximately 20 mTorr to 70 mTorr and between approximately 200 W to 300 W, respectively.

FIG. 2B illustrates pad oxide layer 202, pad nitride layer 204 and hard mask layer 206 after patterning by a dry etching process in accordance with embodiments. FIG. 2B also illustrates that semiconductor substrate 200, which may be patterned by the pattern of hard mask layer 206, pad nitride layer 204 and/or pad oxide layer 202, may be etched to a certain depth by dry etching. In embodiments, the depth may be between approximately about 3000 Å to 5000 Å, and may form a shallow trench where an STI layer may be formed thereover. In embodiments, after forming the shallow trench, the photoresist may be removed.

Figure 2C:
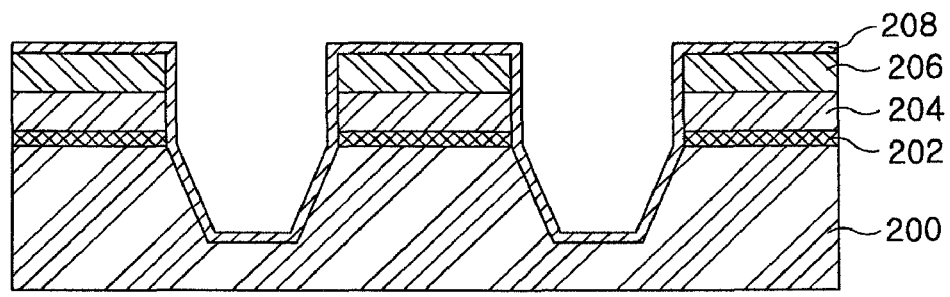

Referring to FIG. 2C, liner insulating layer 208, for example a nitride layer, may be substantially thinly formed over a substrate having a shallow trench formed thereon. According to embodiments, liner insulating layer 208 may be substantially thinly formed over an inner side of a shallow trench, pad oxide film 202, pad nitride film 204 and/or hard mask film 206. In embodiments, liner insulating layer 208 may be used to reduce stress of semiconductor substrate 200 after a dry etching process is finished.

Figure 2D:
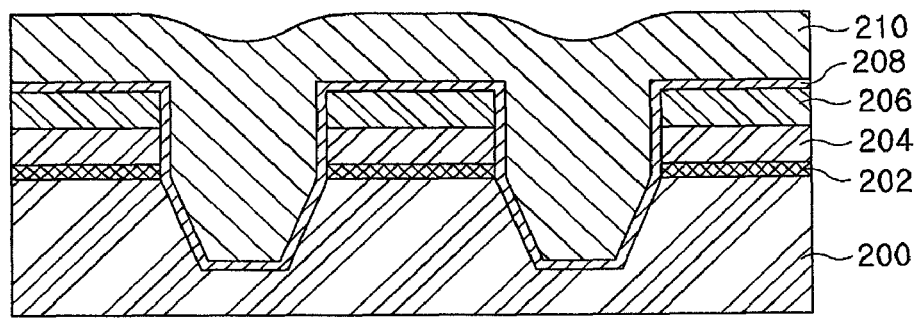
Figure 2E:
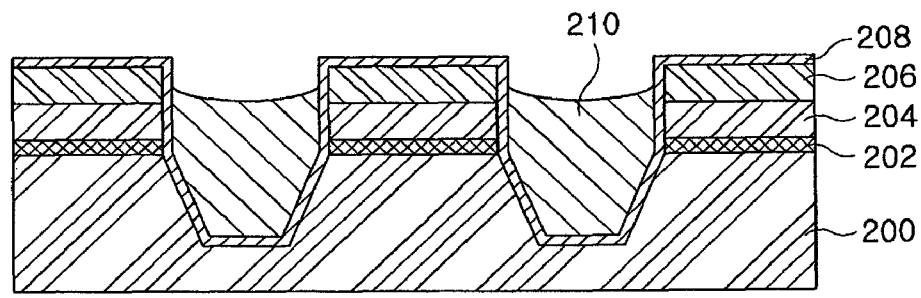

Referring to FIG. 2D, a gap-fill insulating layer 210 such as a silicon oxide (e.g., $SiO_2$) layer and/or a tetraetylorthosilicate (TEOS) layer may be deposited to bury a shallow trench. According to embodiments, a first chemical mechanical polishing (CMP) process may be performed over gap-fill insulating layer 210. In embodiments, a first CMP may be performed over a gap-fill insulating layer to target and/or expose a liner insulating layer. In embodiments, first CMP process may be conducted over gap-fill insulating layer 210 until target liner insulating layer 208 is exposed, in contrast to alternative processes where a CMP process is conducted over a gap-fill insulating layer and a liner insulating layer until a hard mask layer is exposed. While a dishing effect may occur when a CMP process is conducted over a gap-fill insulating layer and a liner insulating layer in alternative processes, a dishing effect does not occur in accordance with embodiments at least since liner insulating layer 208 may not be removed during the first CMP process. Referring to FIG. 2E, gap-fill insulating layer 210 may be slightly removed in a downward direction during a first CMP process.

Figure 2F:
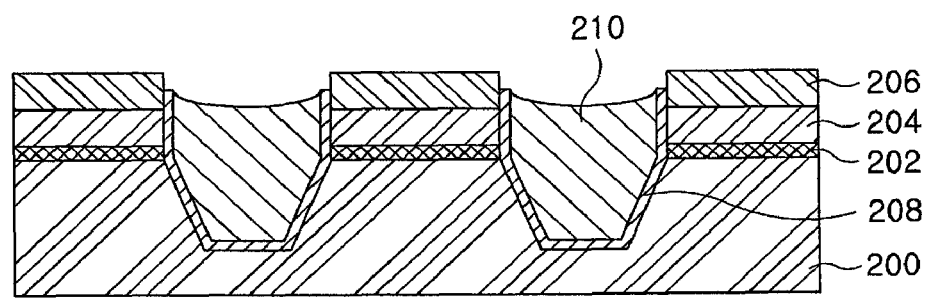

Referring to FIG. 2F, a liner insulating film formed after a first CMP process may be partly removed. According to embodiments, a portion of liner insulating layer 208 exposed by first CMP process may be eliminated to expose the surface of hard mask layer 206. In embodiments, a portion of liner insulating layer 208 may eliminated by a etching process, for example front dry etching, front wet etching, dry etching using a mask pattern, and/or a wet etching using a mask pattern.

Figure 2G:
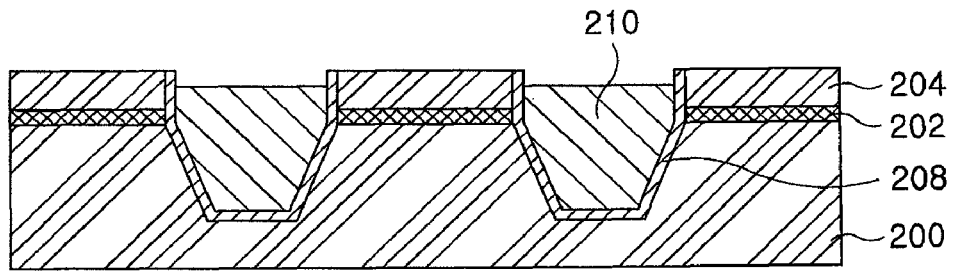

Referring to FIG. 2G, a second CMP process may be performed over a hard mask layer, for example hard mask layer 206 illustrated in FIG. 2F. According to embodiments, a second CMP process may be performed over gap-fill insulating layer 210 to target and/or etch a portion of liner insulating layer 208, which may be exposed. In embodiments, second CMP process may include eliminating hard mask layer 206 and/or eliminating a portion of liner insulating layer 208 and gap-fill insulating layer 210. FIG. 2G. illustrates liner insulating film 208 and gap-fill insulation film 210 formed after second CMP process.

Figure 2H:
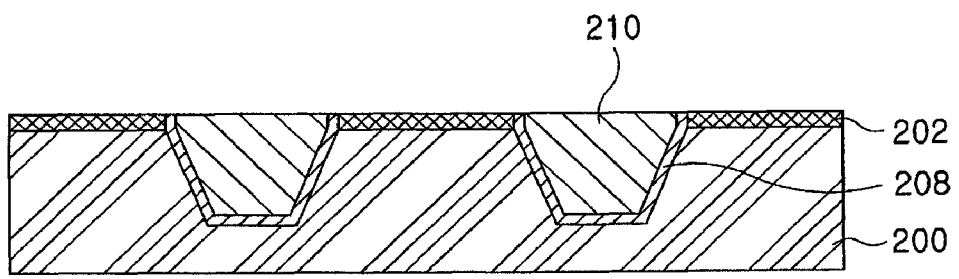
Figure 2I:
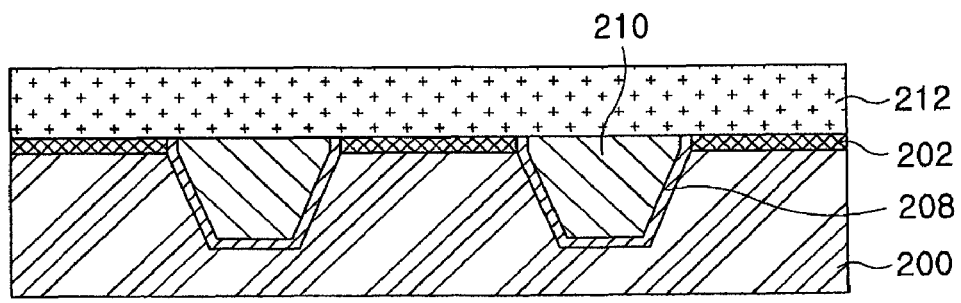

Referring to FIGS. 2H and 2I, a pad nitride layer, for example pad nitride layer 204 illustrated in FIG. 2G, may be removed. In embodiments, pad nitride layer 204 may be eliminated with a portion of gap-fill insulating layer 210, and gap-fill insulating layer 210 may be formed to be at substantially the same the plane as pad oxide layer 202. In embodiments, etching may be preformed through a wet etching process. A gate layer 212 may be formed over pad oxide layer 202 and/or gap-fill insulating layer 210 to complete a STI layer in accordance with embodiments. In embodiments, gap-fill insulating layer 210 may have a substantially and/or relatively planar polished surface.

It will be obvious and apparent to those skilled in the art that various modifications and variations can be made in the embodiments disclosed. Thus, it is intended that the disclosed embodiments cover the obvious and apparent modifications

What is claimed is:

1. A method comprising:
   forming a trench over a substrate;
   forming a liner insulating layer over the trench;
   depositing a gap-fill insulating layer over said liner insulating layer;
   performing a first chemical mechanical polishing over said gap-fill insulating layer to expose a portion of said liner insulating layer;
   removing said exposed portion of said liner insulating layer by etching; and
   performing a second chemical mechanical polishing over said gap-fill insulating layer,
   wherein said forming the trench includes:
      growing a pad oxide layer over the substrate, wherein the substrate comprises a semiconductor substrate;
      growing a pad nitride layer over said pad oxide layer;
      depositing a hard mask layer over said pad nitride layer; and
      patterning at least one of said hard mask layer, said pad nitride layer and said pad oxide layer to form the trench, and
   wherein during said second chemical mechanical polishing, said hard mask layer, a portion of said liner insulating layer and a portion of said gap filling insulating layer are removed such that said pad nitride layer is exposed.

2. The method of claim 1, further comprising:
   removing, after said second chemical mechanical polishing, said pad nitride layer to expose said pad oxide layer; and
   forming a gate layer over said semiconductor substrate.

3. A method comprising:
   forming a trench over a substrate;
   forming a liner insulating layer over the trench;
   depositing a gap-fill insulating layer over said liner insulating layer;
   performing a first chemical mechanical polishing over said gap-fill insulating layer to expose a portion of said liner insulating layer;
   removing said exposed portion of said liner insulating layer by etching; and
   performing a second chemical mechanical polishing over said gap-fill insulating layer,
   wherein said forming the trench includes:
      growing a pad oxide layer over the substrate, wherein the substrate comprises a semiconductor substrate;
      growing a pad nitride layer over said pad oxide layer;
      depositing a hard mask layer over said pad nitride layer; and
      patterning at least one of said hard mask layer, said pad nitride layer and said pad oxide layer to form the trench, and
   wherein the patterning comprises:
      a dry etching process including an etching reaction gas comprising $O_2$, $CHF_3$ and Ar.

4. The method of claim 3, wherein in the patterning, the $O_2$ is provided at a rate between approximately 0 sccm to 20 sccm, the $CHF_3$ is provided at a rate between approximately 40 sccm to 80 sccm and the Ar is provided at a rate of between approximately 6 sccm to 120 sccm.

5. The method of claim 3, wherein in the patterning, the etching process comprises a pressure between approximately 20 mTorr to 70 mTorr and a RF power between approximately 200 W and 300 W.

6. A method comprising:
   forming a trench over a substrate;
   forming a liner insulating layer over the trench;
   depositing a gap-fill insulating layer over said liner insulating layer;
   performing a first chemical mechanical polishing over said gap-fill insulating layer to expose a portion of said liner insulating layer;
   removing said exposed portion of said liner insulating layer by etching; and
   performing a second chemical mechanical polishing over said gap-fill insulating layer,
   wherein the depth of the trench is between approximately 3000 Å to 5000 Å.

7. A method comprising:
   forming a trench over a substrate;
   forming a liner insulating layer over the trench;
   depositing a gap-fill insulating layer over said liner insulating layer;
   performing a first chemical mechanical polishing over said gap-fill insulating layer to expose a portion of said liner insulating layer;
   removing said exposed portion of said liner insulating layer by etching; and
   performing a second chemical mechanical polishing over said gap-fill insulating layer,
   wherein a portion of said gap-fill insulating layer is removed in a downward direction during said first chemical mechanical polishing.

* * * * *